(12) United States Patent
Gross et al.

(10) Patent No.: US 10,061,738 B2
(45) Date of Patent: Aug. 28, 2018

(54) EPHEMERAL PERIPHERAL DEVICE

(71) Applicant: JONKER LLC, Zephyr Cove, NV (US)

(72) Inventors: John Nicholas Gross, Berkeley, CA (US); David K.Y. Liu, Fremont, CA (US)

(73) Assignee: JONKER LLC, Zephyr Cove, NV (US)

( * ) Notice: Subject to any disclaimer, the term of this patent is extended or adjusted under 35 U.S.C. 154(b) by 0 days.

(21) Appl. No.: 15/141,320

(22) Filed: Apr. 28, 2016

(65) Prior Publication Data

US 2016/0239457 A1    Aug. 18, 2016

Related U.S. Application Data

(63) Continuation-in-part of application No. 14/865,971, filed on Sep. 25, 2015.

(Continued)

(51) Int. Cl.

| G11C 16/14 | (2006.01) |
|---|---|
| G06F 13/42 | (2006.01) |
| G06F 3/06 | (2006.01) |
| G11C 16/22 | (2006.01) |
| G11C 16/26 | (2006.01) |
| G11C 7/24 | (2006.01) |
| G11C 17/18 | (2006.01) |
| H04W 88/02 | (2009.01) |
| G11C 13/00 | (2006.01) |

(52) U.S. Cl.
CPC .......... *G06F 13/4282* (2013.01); *G06F 3/065* (2013.01); *G06F 3/0622* (2013.01); *G06F 3/0679* (2013.01); *G11C 7/24* (2013.01); *G11C 16/14* (2013.01); *G11C 16/22* (2013.01); *G11C 16/26* (2013.01); *G11C 17/18* (2013.01); *G11C 13/0004* (2013.01); *G11C 13/004* (2013.01); *G11C 13/0059* (2013.01); *H04W 88/02* (2013.01)

(58) Field of Classification Search
None
See application file for complete search history.

(56) References Cited

U.S. PATENT DOCUMENTS

| 4,266,283 A | 5/1981 | Perlegos et al. |
|---|---|---|
| 4,409,670 A | 10/1983 | Herndon et al. |

(Continued)

FOREIGN PATENT DOCUMENTS

CN    103730164 A    4/2014

OTHER PUBLICATIONS

Aritome, S., et al., "Reliability Issues of Flash Memory Cells," Proc. IEEE, vol. 81, No. 5, May 1993.

(Continued)

*Primary Examiner* — Douglas King
(74) *Attorney, Agent, or Firm* — Law Office of J. Nicholas Gross, P.C.

(57) ABSTRACT

An ephemeral system includes an ephemeral communications device and associated ephemeral memory system (on-board or peripheral) for securing user data. Different secure operating modes are provided for customizing user security requirements across end-to-end communications links, including in exchanges of electronic data between smart-phone devices.

19 Claims, 5 Drawing Sheets

Integrated Read/Program Operation

Related U.S. Application Data

(60) Provisional application No. 62/057,856, filed on Sep. 30, 2014.

(56) References Cited

U.S. PATENT DOCUMENTS

| | | | |
|---|---|---|---|
| 6,345,000 B1 | 2/2002 | Wong et al. | |
| 6,625,734 B1 | 9/2003 | Marvit et al. | |
| 7,024,683 B1* | 4/2006 | Gee, Jr. | H04N 7/163 348/725 |
| 7,092,288 B2 | 8/2006 | Lojek | |
| 7,199,394 B2 | 4/2007 | Mandell et al. | |
| 7,260,672 B2 | 8/2007 | Garney | |
| 7,273,766 B1 | 9/2007 | Lan et al. | |
| 7,489,542 B2 | 2/2009 | Chen et al. | |
| 7,679,945 B2 | 3/2010 | Rizzo et al. | |
| 7,831,790 B2* | 11/2010 | Lambert | G06F 21/78 711/163 |
| 7,881,108 B2 | 2/2011 | Cornwell et al. | |
| 8,327,068 B2 | 12/2012 | Nakanishi et al. | |
| 8,331,128 B1 | 12/2012 | Derhacobian et al. | |
| 8,374,746 B2 | 2/2013 | Plante | |
| 8,456,880 B2 | 6/2013 | Norman | |
| 8,488,397 B2 | 7/2013 | Elfadel et al. | |
| 8,745,347 B2 | 6/2014 | Ferren et al. | |
| 8,817,530 B2 | 8/2014 | Alam et al. | |
| 8,909,725 B1 | 12/2014 | Sehn | |
| 2002/0046385 A1* | 4/2002 | Boehm | G11C 29/52 714/799 |
| 2003/0131060 A1 | 7/2003 | Hartselle et al. | |
| 2003/0161186 A1 | 8/2003 | Aasheim et al. | |
| 2004/0047202 A1 | 3/2004 | Tanzawa et al. | |
| 2005/0051053 A1 | 3/2005 | Wisnudel et al. | |
| 2006/0126484 A1 | 6/2006 | LeBlanc et al. | |
| 2007/0233955 A1 | 10/2007 | Luo et al. | |
| 2008/0162869 A1 | 7/2008 | Kim et al. | |
| 2009/0046499 A1* | 2/2009 | Philipp | G11C 13/0004 365/163 |
| 2009/0208692 A1 | 8/2009 | Lindholm et al. | |
| 2011/0138192 A1 | 6/2011 | Kocher et al. | |
| 2011/0213845 A1* | 9/2011 | Logan | H04L 51/18 709/206 |
| 2012/0208595 A1 | 8/2012 | Norman | |
| 2012/0292613 A1 | 11/2012 | Shionoiri et al. | |
| 2013/0070530 A1 | 3/2013 | Chen et al. | |
| 2013/0265830 A1 | 10/2013 | Bisen | |
| 2013/0290443 A1 | 10/2013 | Collins et al. | |
| 2013/0346805 A1 | 12/2013 | Sprouse et al. | |
| 2014/0068183 A1 | 3/2014 | Joshi et al. | |
| 2014/0331279 A1* | 11/2014 | Aissi | G06F 21/53 726/1 |

OTHER PUBLICATIONS

Gao, W. and W. Martin Snelgrove, "The floating gate MOS device as an analogue trimming element," Microelectronics Journal, vol. 25, No. 5, pp. 353-361, Aug. 31, 1994.

Geldman, J., "Sanitize Command," Technical Committee T13: AT Attachment, Internet. Available at http://www.t13.org/.../e07197r7-T13_Sanitize_Command_Proposal.pdf, Jun. 10, 2008.

Gerber, A., et al., "Low-Voltage Operation of Metal-Ferroelectric-Insulator-Semiconductor Diodes Incorporating a Ferroelectric Polyvinylidene Fluoride Copolymer Langmuir-Blodgett Film," Stephen Ducharme Publications, Paper 30, Jul. 26, 2006.

Huang, Yifei, "Amorphous Silicon TFT Based Non-Volatile Memory" Diss. Internet. Available at https://www.princeton.edu/sturm/publications/phd-theses/pdfs/Part%20II%20Yifei_Huang_thesis.pdf. Last visited Jan. 20, 2016.

Kim, J. H., et al., "Charge Loss Mechanisms in a Stacked-Gate Flash EEPROM Cell with an ONO Inter-Poly Dielectric," J. Korean Physical Soc., vol. 39, No. 6, pp. 1103-1106, Dec. 6, 2001.

Kissel, Richard, et al., "Guidelines for Media Sanitization," NIST Special Publication 800-88, Rev. 1, Dec. 2014.

Patrizio, A., "DVDs That Self-Destruct," Wired, Jan. 20, 2000.

Postel-Pellerin, J., et al. "Charge Loss Activation During Non-Volatiles Memory Data Retention," CAS International 2012, vol. 2, pp. 377-380, Oct. 15-17, 2012.

Reece, T., "Characterization of Metalferroelectric-Insulator-Semiconductor Structures Based on Ferroelectric Langmuir-Blodgett Polyvinylidene Fluoride Copolymer Films for Nondestructive Random Access Memory Applications," Theses, Dissertations, and Student Research: Department of Physics and Astronomy, University of Nebraska-Lincoln, Dec. 6, 2007.

Sakai, Shigeki and Mitsue Takahashi, "Recent Progress of Ferroelectric-Gate Field-Effect Transistors and Applications to Nonvolatile Logic and FeNAND Flash Memory," Materials, vol. 3., pp. 4950-4964, Nov. 18, 2010.

Swanson, Steven and Michael Wei, "Safe: Fast, Verifiable Sanitization for SSDs or: Why Encryption Alone is not a Solution for Sanitizing SSDs," Non-Volatile Systems Laboratory, Computer Science and Engineering, Univ. Calif. San Diego, Oct. 13, 2010.

Vasileska, Dragica, "Modeling of Non-Volatile Memories with Silvaco," Arizona State University, Jul. 6, 2011.

Wei, M., et al. "Reliably Erasing Data from Flash-Based Solid State Drives." FAST. vol. 11. 2011.

Zhao, C., et al., "Review on Non-Volatile Memory with High-k Dielectrics: Flash for Generation Beyond 32 nm," Materials, vol. 7, pp. 5117-5145, Jul. 15, 2014.

* cited by examiner

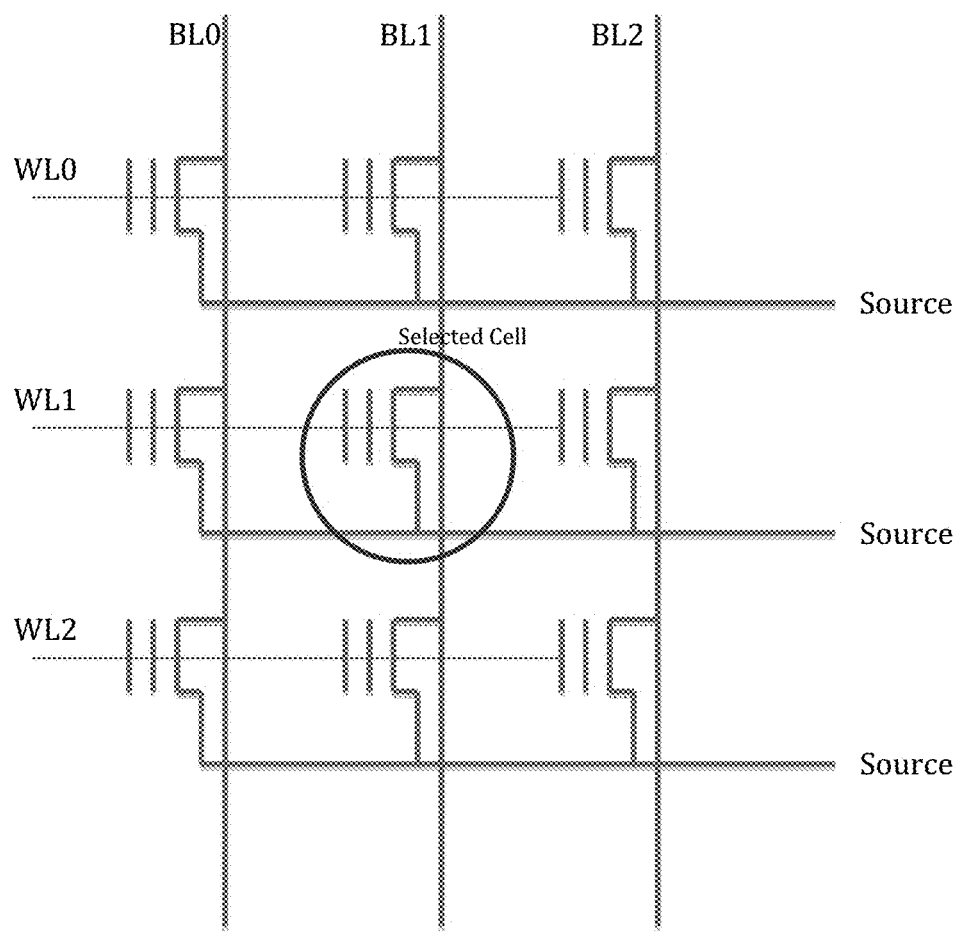
Figure 1. Cell array with selected cell highlighted

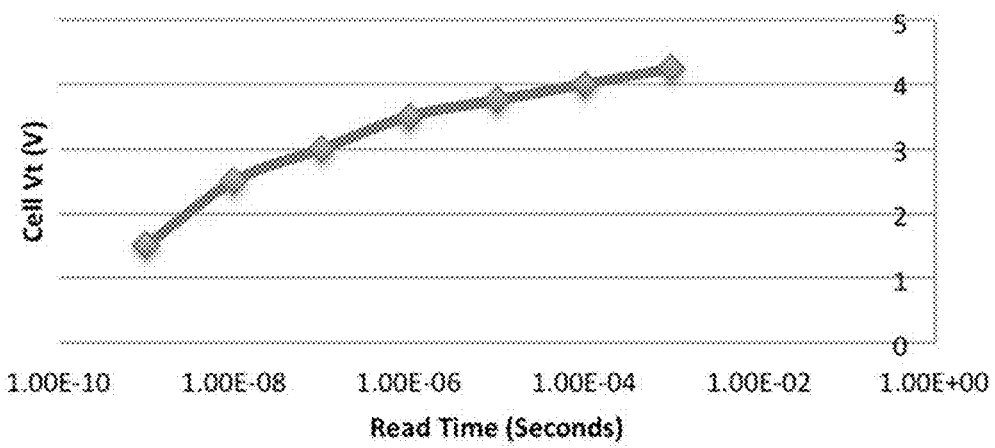
Figure 2A. Vt of a Programmed cell as a function of Read time
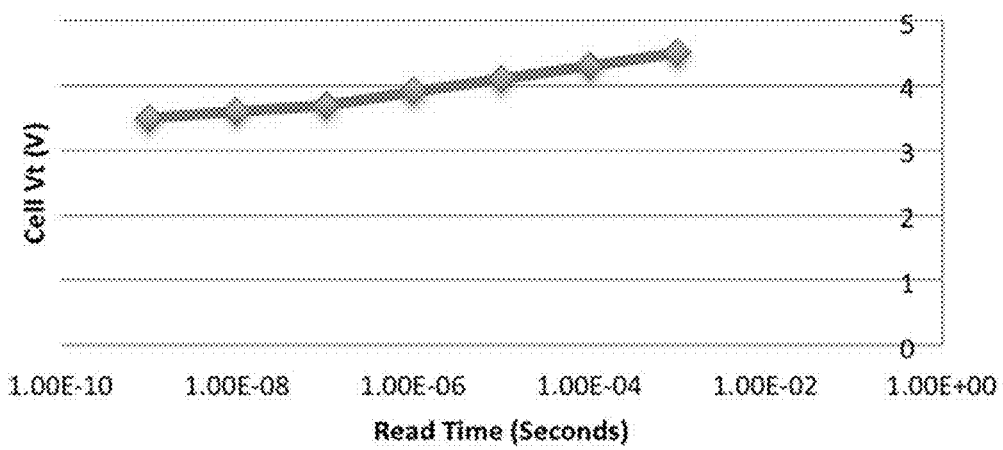
Figure 2B. Vt of an Erased cell as a function of Read time

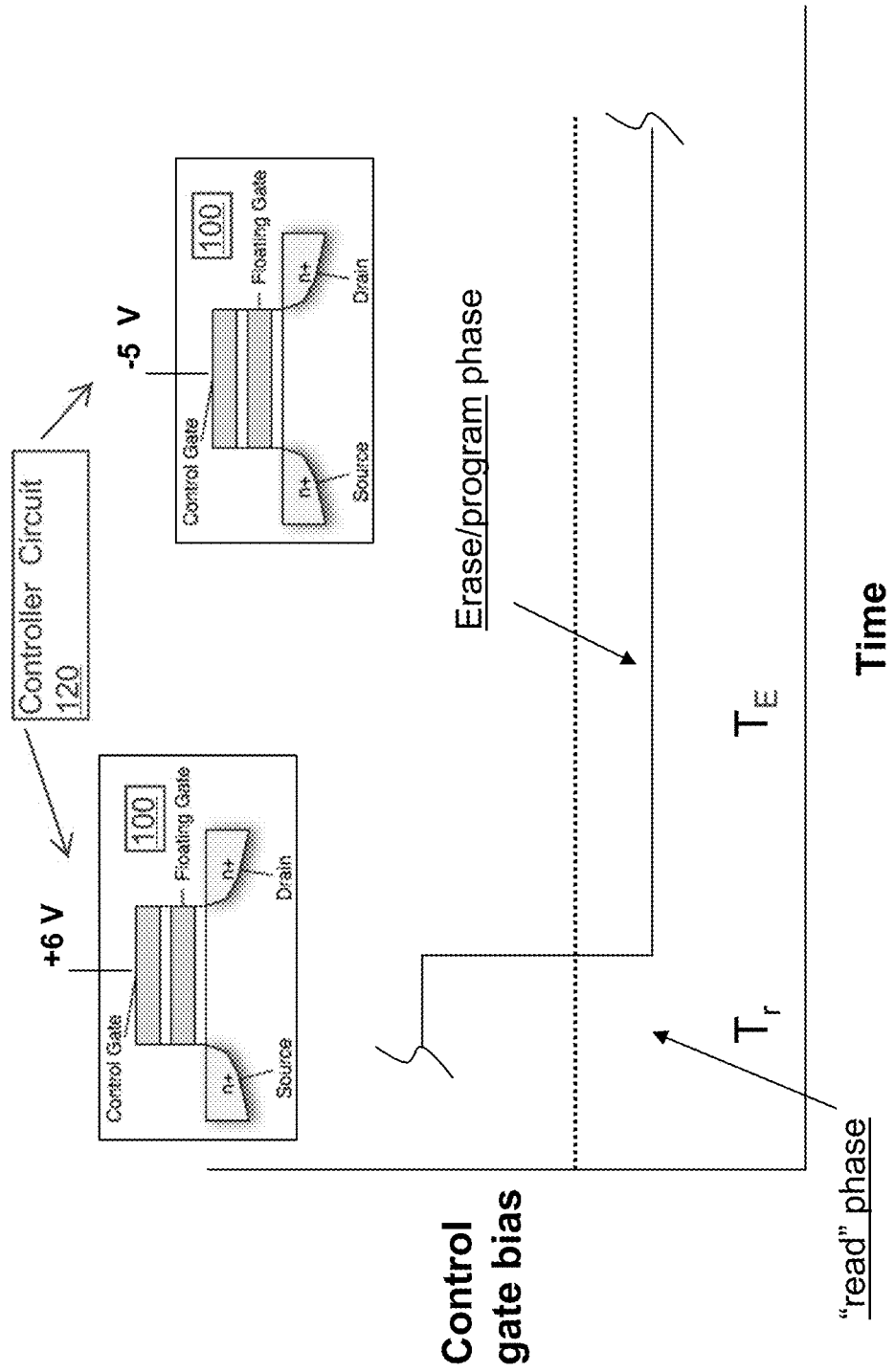

EPHEMERAL PERIPHERAL DEVICE

RELATED APPLICATION DATA

The present application claims priority to and is a continuation-in-part of Ser. No. 14/865,971 filed Sep. 25, 2015, which application in turn claims the benefit under 35 U.S.C. 119(e) of the priority date of Provisional Application Ser. No. 62/057,856 filed Sep. 30, 2014. This application is also related to application Ser. No. 15/141,567, filed on the same date herewith. All of those applications are hereby incorporated by reference.

FIELD OF THE INVENTION

The present invention relates to devices which are useable as ephemeral peripherals/memories. The invention has particular applicability to smartphone and other portable applications where is it desirable to treat and secure communications data using separate dedicated peripherals.

BACKGROUND

Conventional nonvolatile memory cells, such as OTP, EPROM, flash memory, or even PCM, are designed and in fact usually optimized to retain their data not only at ambient storage condition, but also during other device operations, including at data accessing conditions. That is, a read operation, or a data accessing operation, is typically performed under very benign biasing conditions to avoid any inadvertent change to the stored data. For example, in a typical floating gate nonvolatile memory cell, typically electrons that have been injected unto the floating gate (from a channel created between a source and drain region of the cell) are used as the stored data. The presence or absence of electrons on the floating gate defines a logic value corresponding to either a "1" state or a "0" state, or vice versa.

The cells are engineered so that these electrons are retained on the floating gate during either the idle/quiescent storage conditions or during the read operations. Read operations implemented by conventional flash memory controllers are designed such that no additional electrons are either injected unto the floating gate, or taken out of the floating gate. This way, the integrity of the stored data is preserved with data accessing operations. See e.g., US Publication No 2013/0346805 incorporated by reference herein. This feature of "access" non-volatility is highly desirable in applications where the same storage data is accessed many times, such as the case of stored program codes or other frequently accessed data which is not intended to be changed. However, there is a need in the art for memory devices that can service other applications in which continued access to data is not necessary, or in fact, is undesirable.

Recently problems have also arisen in connection with users desiring to maintain better privacy over the content of their communications on smartphones, including images, text messages, etc. While some security is offered by convention passwords, encryption, etc., these techniques alone are still vulnerable to hacking and reverse engineering. To date there are few if any truly secure tools for effectuating the type of transient, ephemeral behavior found in oral conversations to electronic communications.

SUMMARY OF THE INVENTION

An object of the present invention, therefore, is to overcome the aforementioned limitations and conventions of the prior art.

A first aspect covers a non-volatile memory cell device (which can be floating gate based device) stores a logic state based on a value of a charge physically present in a memory cell, such that a first amount of charge represents a first logical value, and a second amount of charge represents a second logical value.

A hybrid read operation implemented on the device (preferably a single integrated circuit) is configured to effectuate, either simultaneously or through a two-step process, both: i) a read of the stored memory cell logic state during a first phase; and ii) an erase of the stored memory cell logic state during an immediately subsequent second phase.

A programmable onboard controller effectuates the bias conditions necessary for the hybrid or modified read operation. Aspects of the invention therefore are directed to both the circuits and methods that bring about the new type of read operation. In some embodiments phase change materials based cells can be used as well for a memory array.

In another aspect, an ephemeral memory device is adapted to be coupled to and store selected data from one or more applications executing on a first separate host computing device. The device generally comprises an interface circuit adapted to exchange ephemerally designated data between the ephemeral memory device and the first separate host computing device;

an ephemeral memory circuit adapted to store ephemerally designated data; a controller circuit coupled to the interface circuit and the ephemeral memory, and being adapted to process and enforce ephemeral parameters for data specified by the one or more applications on the first separate host computing device. The ephemeral parameters can include instructions for example specifying a one time access read operation on ephemerally designated data for the one or more applications. A one time access read operation performed by the controller circuit is implemented through a hybrid memory operation that simultaneously reads and physically and permanently erases the ephemerally designated data on said ephemeral memory circuit, preferably using the previously described OTA cell. In this manner, the ephemeral memory device imparts ephemeral behavior to selected data (preferably of the user's choosing) received by a first separate host computing device. In instances where onboard ephemeral memory is available, it may be used in addition to or in lieu of a peripheral.

Yet other aspects cover a host computing device that is configured to cooperate with an ephemeral peripheral, and implement a secure proxy for communications data.

Other aspect are directed to effectuating secure, ephemeral communications links end to end between wireless devices so that users can exchange multimedia data more securely and with fewer concerns of loss or intrusion over their data.

It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions. While described in the context of a non-volatile memory device, it will be apparent to those skilled in the art that the present teachings could be used in any number of related applications.

DESCRIPTION OF THE DRAWINGS

FIG. 1 depicts a cell array with a selected cell highlighted in a preferred embodiment of a non-volatile memory device of the present invention;

FIG. 2A shows a preferred Vt of a programmed cell as a function of read time in a preferred embodiment of a non-volatile memory device of the present invention;

FIG. 2B shows a preferred Vt of an unprogrammed cell as a function of read time in a preferred embodiment of a non-volatile memory device of the present invention;

FIG. 3 illustrates a timing diagram of biasing applied during a preferred read operation embodiment of the present invention;

DETAILED DESCRIPTION

Figure 4:
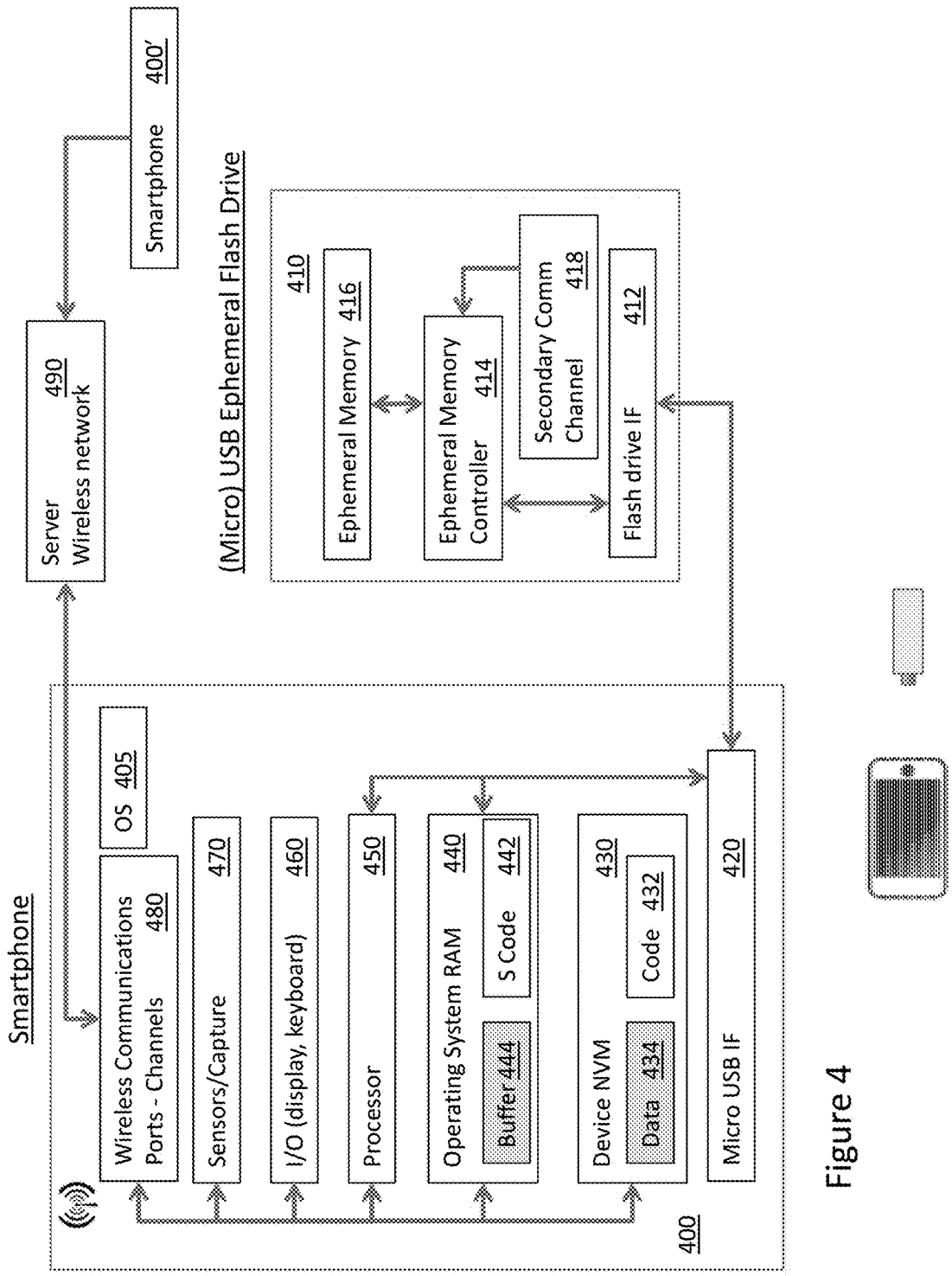
FIG. 4 is a block diagram of a preferred structure of an ephemeral system that includes an ephemeral based host communications device and ephemeral memory peripheral.

The inventors posit a new type of data storage device and access operation, in which data in a memory cell is (effectively) ensured to be erased after it is read, to prevent further access to the original data. As noted below, the inventors believe that there are many new and recent (as well as future) applications where it is desirable (or even necessary) to allow the cell/device data only to be accessed once, and thereafter the data be made no longer available after a first (and only) one time access (OTA) operation is performed. Example applications where an OTA feature is useful include pay-per-view music or movie data, OTA tokens, and other one-time use applications, including facility temporary access applications (single access authorization cards, pass coded tickets, pass coded electronic keys, etc.) secure communications (disappearing email, photos, etc.) certain types of data caches, receive/transmit data buffers, etc. Military and security applications which require periodic data sanitizing are also potential applications. Accordingly the invention(s) address a clear long-felt need left unsolved in the prior art, and enables solutions for new types of applications as well.

One method of achieving this one time access feature is through issuing and performing a new hybrid command, preferably with an onboard memory controller, to erase or re-set the stored data on the memory cells, substantially immediately right after or subsequent to a read operation. In other words, the memory controller is configured to implement a novel hybrid read command, which includes a separate conventional erase operation performed right after a conventional read operation on the data in question during a second access of the cell. This can be effectuated by a simple modification of the array read/write/erase controller firmware implemented in the memory controller.

This first type of One-Time access implementation can work well in applications which do not require an extremely high level of security, and when there is reasonable certainty that the firmware program will be executed properly and completely. In this first embodiment, there is no guaranteed mechanism however to ensure that the erase command is actually carried out after the read operation, since it is conceivable that the erase command can be interrupted right after accessing the data so that it is not carried out completely. For example a power failure or other electrical glitch could interfere with the follow up erase operation. Accordingly, it is possible that the data is still retained and available on the memory cells, thus making it possible for further undesirable access of the data. Even such residual data, however, can be addressed through conventional data sanitizing operations known in the art.

A second embodiment discussed at length herein addresses reading the content of stored data in a nonvolatile memory cell such that the reading or accessing operation itself is modified so that it inherently causes the data to be removed or erased as well, in a form of integrated operation.

In other words, the memory controller is configured to implement a second type of novel hybrid read command, which includes a new type of operation in which charge is both read and removed during a single access cycle/period. As with the first embodiment, this can be effectuated by a simple modification of the array read/write/erase controller firmware implemented in the memory controller. Since it is extremely difficult to interfere with firmware level operations during this single access, the second embodiment's hybrid "erase as part of read" command should be extremely secure.

This second approach ensures that the data can only be accessed once from the systems. Furthermore this method can be applied in different types of Nonvolatile memory, including floating gate storage cells and Phase Change Memory cells.

The concept of a destructive-read command implemented herein hinges on transforming a read command so that—in addition to a read operation—it is also effectuates an operation that erases data (or re-programs them effectively to an initial unprogrammed Vt state) stored in the nonvolatile memory cell. The main feature of the present disclosure therefore is to take advantage of operations previously known to selectively place electrons on the cell, and convert them effectively into an erase operation.

So as to be consistent and reliable like prior read methods, however, a destructive read operation should similarly only remove stored data on cells that are selected for reading. That is, there should be no read-disturb on non-selected cells during the destructive read access operation. Otherwise the data on cells that are yet to be accessed, but sharing the same bitlines or wordlines could also be erased. In the present case, by using channel hot electron injection, which is a more bit-specific process, an erase can be implemented that does not substantially or adversely affect a logic state of adjoining cells. This concept should be applicable to many of the most common types of nonvolatile memory cells, and this invention will use the examples of both floating gate memory cells and the Phase Change Memory cells.

In a preferred embodiment of implementing this innovation with a conventional floating gate flash memory cell, one can define a high Vt state, or state with injected electrons on the floating gate to be a logical erased or reset state. A cell with low Vt or UV Vt can be considered as a logical programmed state.

A bulk erase operation is done with a programmed memory controller by applying a high voltage on the control gate of all cells with their associated source, drain regions, and substrate all held at 0V. Under such conditions a cell's threshold voltage will be raised to greater than a certain voltage level, for example greater than 3.5V. This high Vt state represents an erased state, or a logical "0" state. It will be understood that other values will be useful or necessary in other applications, and depending on the cell/array design.

A programming operation is done with the programmed memory controller by applying a voltage of −5V on a selected wordline and a voltage of 5V on a selected bit line to facilitate removal of electrons on the floating gate of the selected cell to bring the Vt down to somewhere preferably below 2.0V. This low Vt state represents a programmed state, or a logical "1" state. It will be understood of course that other techniques are possible for bulk erase and program, and will vary according to the specific cell implementation.

During the improved "destructive" read operation of the present disclosure, bias conditions are selected and imposed by a memory controller to favor a fast injection of additional channel hot electrons to bring a cell to a Vt greater than 3.5V immediately after a read, regardless of an initial threshold voltage on the cell. The two phases of this new read operation are illustrated in FIG. 3, which identifies a typical floating gate based cell 100 with control gate, floating gate, source/drain regions and a channel. A memory controller circuit 120 implements the biasing conditions for the cell as set out herein. As noted above, because CHEI is mostly bit-specific, it affords an erase of individual cells without disturbing other adjacent cells (FIG. 1).

Thus as seen in FIG. 3 a novel preferred read operation implemented by control circuit 120 preferably places a control gate voltage of 6V and a drain voltage of 5V on the selected cell, with the source and the substrate biased at 0V during a first phase ($T_R$). As is known, a cell may be in a programmed (single or multi-level bit) or unprogrammed state. For a cell that is originally in a programmed state, or a low Vt state, the cell initially has a large amount of drain current when it is read (to detect a logical 1 (or other multi-level) value), and almost right away electrons are injected by the control circuit 120 unto the floating gate (during a second phase $T_E$), causing the current to drop almost instantaneously. Conversely, during the read operation a cell that initially has a high Vt (an unprogrammed cell) would not see or demonstrate such drastic reduction (or change) in the drain current since the cell already has injected electrons from the previous erase operation, and does not conduct very much drain current in the first phase. The result is an integrated read instruction-command in which both a read and an erase (or re-program to an initialized state) operation are achieved during a single period of access/addressing the cell.

The original stored data on the cell can be sensed during a first phase of the integrated operation in at least one of two ways, either by: 1) integrating a total charge flowing through the cell during an entire erase cycle (i.e., the total charge flowing through a logic "0" bit will be significantly different than that flowing through a logic "1" (or multi-level) bit during the access and can be easily measured); and/or 2) detecting how a total change in drain current occurs as a function of time (i.e., the current flowing through the cell should change dramatically for a logic "1" bit vs a logic "0" bit). The second sensing method can be implemented in a conventional differential-pair sensing scheme (not shown) in which the current of the selected cell is compared with an erased referenced cell, and the initial difference in current can be latched and read as a valid data, prior to the selected cell being erased. Regardless of an initial stored data value, or cell's threshold voltage, in this fashion, once a cell is accessed, all such cells are set to a high Vt level, or at an erased level during a second phase. Both sensing techniques are possible and it will be understood that the particular implementation will vary according to system, speed requirements. This permits the data to be reset during the process of accessing the data. Accordingly, in preferred embodiments, once a cell is read, the original data is destroyed, and the state of the cell is thereafter at an erased state (until re-programmed of course).

Since the read operation is done under bias conditions that bring about traditional channel hot electron injection mode, the effects on the device are well known and should be minimal. This implementation achieves a Nonvolatile memory array that is durable, has a reasonably good data retention lifetime during ambient storage, and offers write/program with only One-Time-Accessibility.

Table 1 below illustrates preferred bias conditions imposed on the cells in a typical memory array during various operations by control circuit 120, for both selected and unselected cells. It should be noted that the regular erase operation referenced below is done in bulk, or by blocks, while the reading and programming operations are preferably done on the selected bytes or bits. The various bias voltages, timings for the various phases, etc., are implemented by a controller circuit 120 which can be configured using conventional techniques to effectuate the necessary signals for the memory access commands. While the example is given for a single logic level cell, it will be understood that other bias conditions and cell types may be used to implement multi-level values.

TABLE 1

| Operation | Selected Drain | Unselected Drain | Selected Gate | Unselected Gate | Source | Substrate |
| --- | --- | --- | --- | --- | --- | --- |
| Erase | 0 V | 0 V | 10 V | 10 V | 0 V | 0 V |
| Program | 5 V | 0 V | −5 V | 0 V | 0 V | 0 V |
| Read | 5 V | 0 V | 6.0 V | 0 V | 0 V | 0 V |

In terms of characterizing the cell behavior as a function of a read or accessing operation, we illustrate the characteristics of the cells as a function of the reading time on the cell to demonstrate the operation of the preferred embodiments. FIG. 1 illustrates the memory cells in a NOR array configuration, with the selected cell being the cell addressed by WL1 and BL1, in accordance with Table 1. Again, because CHEI is used to erase the cells after they are read, secondary disturbs should be minimal on other adjacent cells.

FIG. 2A shows the Vt of a programmed cell at low Vt state, or a "1" state, as a function of the access time when the read voltages are applied on this cell. It is seen that the initial low Vt of the cell (i.e., below about 2 v in this instance) is detected at the beginning or first phase of a read/accessing operation. During this time the data is sensed and its logical value (1, 0) preferably determined by a conventional sensing circuit techniques, which may include the use of differential pair sensing circuitry, as mentioned above. As the reading or accessing operation continues to a second phase, during which significant channel hot electrons have been injected, and the initial Vt of the cell starts to move to a higher Vt due to the injection of the channel hot electrons unto the floating gate.

At end of approximately 10 us (microsecond) (actual results will vary according to particular implementations and can be determined through routine experimentation or simulation), the cell Vt has already moved to a higher Vt than an erased Vt, or a logical "0" state Vt. Thus the cell is effectively erased during a single access which includes the reading operation. It should be noted that as long as the sensing circuit can detect a significant amount of (or change in) current within the first phase of the read operation—in this example, about 10 ns (nanosecond)—the state of the cell can be correctly read and determined to be a "1" state (or a multi-level state in some instances).

Note in some implementations (as alluded to above) the "erase" phase of the read can proceed independently in the background (during a second access) after the cell is read, so that access speed is not unduly compromised. Furthermore from a housekeeping—operational complexity perspective embodiments of the invention offer other unique advantages. For example since all cells are effectively kept or maintained at an erased state, regardless of their original underlying data, a program operation does not have to be preceded with an erase operation as is required in some implementations. In addition from a device wear and leveling perspective, a greater population of cells are maintained in a common and predictable erased state which should improve device longevity.

FIG. 2B shows the Vt of an already erased cell (logical 0 state) that is being read or accessed by memory control circuit 120. As is observed from the figure, the cell continues to increase slightly in Vt, making it more robust in the erased state, or the "0" state. Through the duration of the reading operation, the state of the cell is determined to be a "0" state cell.

In this implementation of accessing the content of the memory cell array, the stored "0" data of the cell is again sensed correctly in the initial first phase portion of the read time (first 10 ns), as can be seen by the fact that the drain current is small to begin with, and does not change significantly—in contrast to a cell with an initial logical 1 state. Thereafter the memory cell is placed again) into an erased state, or the "0" state, regardless of the initial content of the memory cells.

Therefore in both cases, regardless of an initial cell state, a one time accessibility is achieved in the second embodiment during a single access since the content of the cell is always destroyed and reset to an erased state during any read operation on the cell. This approach can help solve at least one significant problem now in the art, namely, the fact that mobile phone apps (e.g. Snapchat, Cyberdust) that purport to delete user texts, images, etc., do not actually physically or permanently delete such data. Rather, they remove pointers to such data, or rename the files in question to make them less discoverable at a logical/software layer level. Moreover embodiments of the invention still retain data after power is removed/lost, and are thus superior to any prior art DRAM based techniques that may mimic such functionality. It will be understood that the invention is also compatible with and can be used with encrypted messages/data as well.

In some embodiments it may be desirable to couple the read data from the array into a separate conventional memory (which also may be NVM) buffer (not shown) of a predetermined size. That way, in the event of an inadvertent disruption or failure in the read/access process for a relative large file (which normally require a re-read of the data) the most recent data (whose size can be configured for a particular application) can still be reliably read by an external circuit, device, etc. For example in a movie context, a few minutes of content may be buffered, while for music applications a few seconds, and so on.

A preferred embodiment of an ephemeral system that includes a mobile device 400 (which may a smartphone or other mobile computing device) and ephemeral memory 410 which incorporates the memory innovations described above is shown in FIGS. 4 and 5. A graphical depiction of such devices is also shown in FIG. 4. A second smartphone 400' operated by a second user communicates to device 400 through a server and/or other wireless communications network 490. Device 490 also may be optionally configured with ephemeral memories such as described herein to further improve data security/privacy through one time access. This enables end to end OTA behavior as explained further below.

A smartphone 400 includes an operating system 405 (such as iOS or Android) embedded in a secure persistent or non-volatile memory (such as a ROM, EPROM, etc.) for controlling interaction with a user and controlling I/O operations. In some embodiments device 400 may also include an ephemeral memory such as described above as part of the NVM memory. The device 400 also preferably includes typical additional components such as an interface 420, which in some applications includes a micro USB or similar high speed data port. This port can be used to couple additional peripherals to mobile device 400, including so-called flash drives known in the art.

In the present embodiments, in the absence of (or in addition to) existing ephemeral memory on device 400, a micro USB ephemeral flash drive 410 is preferably used to effectuate the goals noted above, namely, a portable one time access persistent, non-volatile memory. It will be understood of course that other form factors may be used according to size, interface, etc. offered by a host device 400. Device 410 may also be implemented as a local cache in accordance with the teachings of U.S. Pat. No. 9,300,719 (incorporated by reference herein) in which a local cache is configured (see device 185 FIG. 1A) to store data for a mobile device.

A flash drive interface circuit 412 known in the art transfers user multimedia data (including for example text, images, videos, audio, etc.) to/from mobile device 400 in accordance with a known Universal Serial Bus (USB) protocol. Device 410 also includes both an ephemeral memory controller 414 and an ephemeral memory 416, both of which were described earlier above in connection with FIG. 1. From the perspective of mobile device 400, device 410 preferably appears as a conventional flash device.

Mobile device 400 also includes conventional non-volatile memory 430, typically in the form of Flash or similar EPROM devices for long term, and in which device data 434 and code 432 are stored in conventional fashion. The data 434 here is retained after power is removed from the device, and may include items such as email, text messages, camera images, video, audio files, etc. that a user has created or received. Code 432 may include both native operating system programs, routines, as well as user applications (or "apps") configured to run on device 400, which may be an iOS or Android based smartphone. The apps may include utilities (email, calendar, notes, camera) as well as games and the like, all of which may create their own data stored in permanent form in memory 430 (until erased). As further noted herein, NVM memory 430 may also include ephemeral memory if so integrated by a device manufacturer.

In most applications, code is executed from a separate transitory RAM memory 440 (DRAM, SRAM or some combination) along with accompanying user data. DRAM (or SRAM) 440 is preferably a different transient type of memory than NVM 430, and requires refresh and/or continuous power (from a batter or other source) to maintain a data state. SRAMs are usually employed to cache frequently used data or code since it is much faster than DRAM. Typically new programs or apps are loaded from NVM 430 to DRAM/SRAM 440 when they are required and reside there until removed.

A specialized processor 450 (which may be in the form of an ASIC or general purpose microprocessor programmed with specific code) controls overall operation of device 400 through specialized firmware and other secure boot routines stored in NVM 430. The processor (or supporting co-processor) also executes the OS, peripheral firmware, native routines and user optional selectable routines in the form of applications commonly known as "apps." Such apps can be downloaded from a number of online sites, including through dedicated online "app" stores operated by large companies such as Apple, Google, etc. In other instances they may be loaded directly already on a host device 400 or ephemeral device 416. In any event, the code associated with such apps is embodied in non-transitory, computer readable medium form to be executed by a processor and related support circuits.

User input/output is preferably provided through customized keyboards, buttons, touch based interactive screens, displays, etc., managed by circuits 460. Other modalities are expected to be implemented in future generations of wireless communications devices. I/O data from such interactions is stored in structures such as buffer 444 where it can be used for operations.

Device 400 preferably includes other wireless data based circuits 480 for preferably communicating wireless data (including through WiFi and cellular network based packet based protocols including but not limited to available wireless industry standards such as CDMA, LTE, etc.) through different types of channels to a second device 400' (which may be a mobile system or other computing device), including voice and text based to a server and/or wireless network computing system 490. Circuit 480 thus preferably includes support for packet switched networks. Additional protocols for IP based communications can be employed as well (such as IEEE 802.xx.y, Bluetooth, etc.) to support Wireless local area network (WLAN) channels. In applications where ephemeral treatment is specified for data at a packet level, these circuits can also include firmware capability for coding and decoding headers for ephemeral packets as identified in Table 2 below. While not currently employed it is contemplated by the inventors that ephemeral treatment may be integrated at the packet level within industry protocols at a later date.

Sensor/capture circuits 470 preferably include functions such as microphones, motion detectors, attitude detection, cameras, location (GPS) and similar well-known devices. Any and all of these circuits may create useful user data for user applications, utilities, games, etc.

It will be understood that FIG. 4 is a simplified diagram intended to elucidate the key features of the invention(s), and that the components of any particular smart mobile device will typically include other features (not shown) and vary according to user specifications, requirements, etc. For example, the device may include its own power source (battery, etc.). Additional functionality and circuitry is expected to be included in such smartphones in the future by skilled artisans as integration of capabilities through additional sensors and improved processing capability becomes more widespread.

One main aspect of the device 400 of the present invention is that—depending on the storage operating mode—some or all data for a file received or transmitted by device 400 can be (optionally) managed by an ephemeral memory app running in part of RAM 440 which stores Tx/Rx and user data temporarily in buffer 444, typically part of a DRAM. Any such data for a file, which would otherwise be stored in a conventional device NVM 430, is instead preferably stored in ephemeral storage 416 (and/or, as noted earlier in ephemeral storage onboard the device 400). In other instances, as described below, a native operating system and processor on a smart device may include direct address/access to allow direct read/write operations to persistent ephemeral memory, bypassing an onboard DRAM entirely.

Any number of device applications can be coded with routine skill using standard development tools for the device in question to effectuate such compliance. For example, a text messaging app 442 (which may be obtained from an online store as noted earlier) executing in memory can buffer and intermediate all or portions of received messages from a text based channel to ensure that they are stored and read from ephemeral memory 416 and thus physically destroyed after reading. This app may also code and decode ephemeral headers for individual packets. Image and text files shared by another user may be received, buffered, read and destroyed in the same fashion. Video/audio files from a content website (not shown) may be downloaded and read in the same manner for one-time play.

Accordingly the invention is not limited by the type of data to be stored and/or perceived by the user. Rather, the intent and effect of the disclosed embodiments is to impart similar ephemeral qualities and characteristics to electronic data items (including as might be needed at different granular logical levels) as that which naturally occurs when two human users interact by spoken dialogue in a personal conversation. In the latter context, of course, the spoken utterance by each user, in the absence of recordation, leaves no permanent trace that can be accessed or exploited by third parties. Thus the present embodiments address concerns and problems peculiar to and rooted in computer technology.

Smartphone 400 therefore preferably includes one or more secure ephemeral apps (described further below) running as code 442 in an operating RAM 440. The secure app preferably manages data storage decisions and options on smartphone 400 so that user and/or system selected data can be offloaded on and retrieved from Micro USB Ephemeral Flash Drive 410 (or onboard ephemeral memory). For example, secure code 442 preferably implements a secure text messaging routine that permits a user of smartphone 400 to communicate with another user (not shown) through port 480 and exchange multimedia data such as text/images. The latter user data preferably passes through device 400 and is stored on Micro USB Ephemeral Flash Drive 410, and (preferably) not in a permanent memory 430 of the smartphone 400 (unless the latter again has native ephemeral memory). In a preferred approach, secure code 442 implements a secure application ("app") that includes various mode capabilities so that user data created or communicated by or through device 400 is not stored in non-ephemeral portions of any permanent memory 430. In addition such app may both code and decode ephemeral headers as they are embodied at the packet level, file level, etc., and perform steganographic coding/decoding as well. It will be understood that secure code 442 may directly implement any number of useful user/system functions or features depending on target goals and requirements.

In other embodiments secure code 442 may simply be a more basic procedure that is called by other system routines and/or user apps only for data storage operations. In other words, a separate standalone text application (such as iMessage, Whatsapp, etc.) may call code 442 as part of data storage/retrieval operations to ensure the OTA aspects noted above. From the perspective of such other apps, the operations of storing and retrieving data are completely transparent as they do not directly access ephemeral drive 410, but they are assured of ephemeral treatment of their respective data.

In still yet other embodiments it will be apparent that any of the functional apps and utilities (camera, email, text, etc.) on device 400 may in fact directly address, store and access data selectively through conventional user configuration options to Micro USB Ephemeral Flash Drive 410 (or onboard ephemeral storage). For example, in a typical user configuration option in smartphone settings, a user can preferably opt to have received and transmitted data routed exclusively through Micro USB Ephemeral Flash Drive 410 (or onboard ephemeral memory) to ensure ephemeral behavior.

Micro USB Ephemeral Flash Drive 410 preferably includes a flash drive interface 412 for exchanging data/control signals with device 400, as well as the basic ephemeral OTA components noted earlier, including an ephemeral memory controller 414 and accompanying ephemeral OTA memory 416. In some applications an optional additional communications chip 418 can be employed to permit a direct secondary communications channel to server/wireless network 490. This chip may support any and all short and long range communications protocols (including WiFi, Bluetooth, and modes normally supported by a smartphone) known in the art now (or later developed) to permit direct reception of ephemerally designated data. This chip may further include capability for encoding and decoding ephemeral packet headers in accordance with the guidelines of Table 2 below. These devices are preferably one or more integrated circuits configured in similar fashion to that described above in connection with FIGS. 1, 2A, 2B and 3.

The combination of a variable sized external flash drive 410 form factor and diverse accompanying ephemeral apps running on smartphone 400 permits a number of flexible configurations in addition to or in lieu of onboard ephemeral memory. Smaller capacities for drive 410 may be used for simple applications such as email, text, etc. Larger capacities may be used for more data intensive applications such as videos, movies, music files, etc. Users can reuse such media to consume multimedia content for pay-per-view type applications, including movies. Vendors may provide physical kiosks at locations such as supermarkets to permit users to directly download OTA content to their respective media through a docking station. Other combinations will be apparent to skilled artisans from the present teachings.

To avoid potential data breaches, device 410 is preferably tethered to device 400 so that it is not readable by others if it is lost, stolen, etc. Secure electronic tethering is known in the art, and can be implemented in the present embodiments automatically by a firmware routine within device 410, which detects a unique device ID for device 400 and thereafter only allows accesses from such device. The unique device ID (encrypted or otherwise) is preferably stored in a secure non-volatile boot memory (such as a one time programmable (OTP)) so that it can only be written once and never modified. In still other instances, device 410 identifies a mismatch between a paired device ID and a device connected through interface 420 prior to initiating access to ephemeral memory 416. In the event of a mismatch device 410 preferably implements a self-erase procedure (or similar routine) to delete any and all content thereon. In still other variants, such as when device 410 includes communications capability, such peripheral can be remotely wiped, again using techniques similar to those employed by other secure services, such as iCloud™ Findmyphone™ and others. In this manner the potential misuse of peripheral device 410 by another user can be minimized.

Some embodiments of the invention therefore effectuate a secure technical bridge for users to extend conventional streaming (and progressive downloading) of multimedia, which may be restricted as part of digital rights management, and can only be achieved with a reasonable broadband connection. For example some websites or applications may only support direct streaming and not storage of multimedia data on a remote device due to content restrictions from a vendor. While this can be circumvented by some known streaming recorders, the present invention allows media vendors to achieve the same result but in an authorized mode. That is, a vendor can extend the reach of their data to users and permit it to be consumed in non-streaming modes, as they can enforce/ensure playback through a decoder or plugin, and be reasonably assured that their data is secure because after such event it is no longer accessible after it is consumed. In some instances, a direct download option may be available if the vendor is satisfied of one-time playback of the media item. In other instances a vendor may permit/support direct ephemeral recording of a stream (which is already performed by some set top boxes such as Hauppage, and software such as Apowersoft, Movavi, Gizmo) to an authorized OTA based receiver to mimic a conventional streaming recording system.

As noted above, the ephemeral memory controller is preferably configured so that the actual data items (not merely keys, file pointers or other logical indexes) are physically destroyed. In this manner the user's data is completely irretrievably removed. It will be understood, however, that some embodiments may simply store an encryption key or other file directory/lookup information in ephemeral form to logically or virtually "delete" the data. In such instances the data may physically remain in storage, but become effectively unreadable as it cannot be retrieved using conventional software routines.

Figure 5:
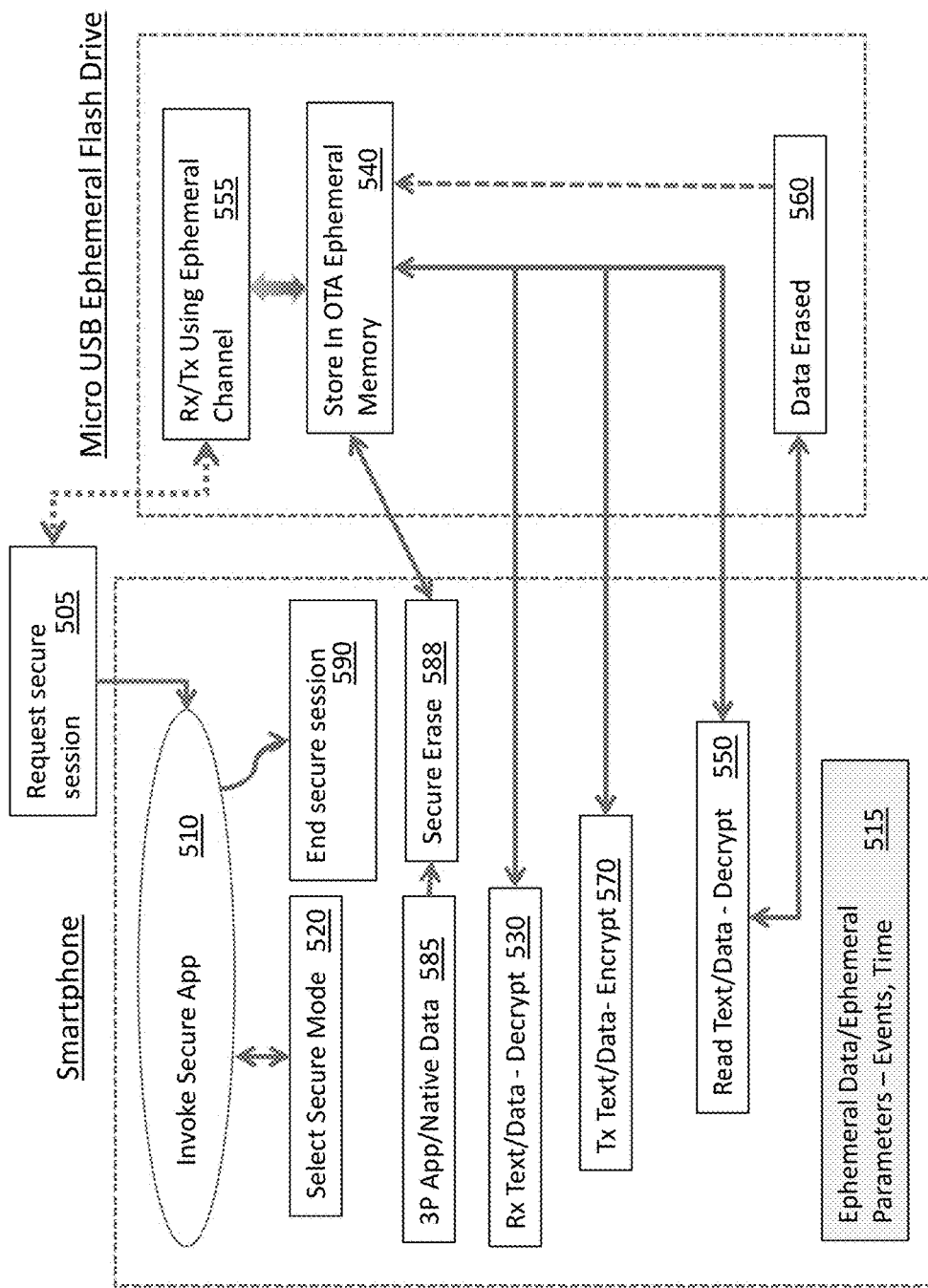
FIG. 5 depicts a preferred process used by smart devices that include (or can be docked with) an OTA memory.

FIG. 5 depicts a preferred process used by smart devices that include (or can be docked with) an OTA memory. A request for a secure data session (or treatment of a particular data item) is initiated at step 505, which, as seen in FIG. 5, may originate from outside a host 500 environment. For example a separate device 400' (FIG. 4) may initiate an ephemeral communications session as a condition of sending a text message, a picture/graphical image, audio recording, video recording, etc. Conversely, device 400 may perform such operation attendant to setting up a session with device 400' for the same purpose.

In other instances a designation of ephemeral treatment is designated on an item by item basis by the sender from device 400.' For example a sender may tag a particular image within a communications app to be treated as ephemeral data. In other applications, each individual communicated packet may be configured to include an ephemeral header defining its treatment. Accordingly a spectrum of treatments are enabled depending on the granular control specified by the participants in a communication.

In some applications, as noted earlier, an onboard communications IC 418 for the ephemeral storage device 410 permits direct initiation of secure data sessions with independent capability. This allows ephemeral identified data between devices 400/400' to flow primarily though OTA memory and without implicating other onboard storage.

In still other instances, a secure session is initiated automatically in response to a docking event between device 400 and device 410, signaling a user's request to employ the features of an ephemeral memory. This docking is preferably detected by hardware within interfaces 412/420 to trigger operation of an OTA mode in the device.

At such point smartphone 500 (or some other form of host computer) preferably invokes (including through user action) an ephemeral storage app at step 510, which may be a standalone secure app with additional functionality as described herein (see app 442 FIG. 4), or a call to (or part of) a routine (from another app) to perform data storage/retrieval operations to an ephemeral memory in an operation 540. In the latter instance, other third party apps can enable and employ ephemeral capability attendant to their normal I/O operations as well. For example, a user of an app originated and controlled by Facebook™ can access and use an ephemeral memory (either onboard device 400 or separate peripheral 410) for videos received from other social media members. Such app can also create and append ephemeral headers (as specified below) to files and packets using known techniques. In yet other embodiments a secure application may be integrated directly into an operating system as a library routine, or other accessible system routine, and be integrated into or called by such program. In such instance it can be invoked in a manner similar to any other available routine embedded on device 400.

At step 520, the smartphone also preferably permits a user to configure the device to operate in different secure modes, including with different levels of data treatment/security. At a first level or as a first parameter, a user can specify whether or not an ephemeral mode should be enabled in the device, and, if so, what type of ephemeral treatment: destructive read, or erase after read, slow/fade erase (see below) and so on. As a second parameter, a user can specify a scope of the OTA operation across different applications within device 400, using different OTA modes.

For example, in a first OTA mode, only data used by a specific ephemeral OTA app (and its related functions, such as texting, images, etc.) are subjected OTA treatment. Preferably, any and all data passing through such app 442 (including both received and transmitted data) is stored exclusively in ephemeral OTA memory 416 (FIG. 4) at step 540, with only smaller data buffers 444 used in DRAM for temporary storage of data. The buffers may be varied and appropriately sized using conventional techniques to accommodate the bandwidth of the application which they serve. For example a communications app receiving user text and static image data at step 530 (from a second device 400' through network 490) may use a much smaller buffer than an application that is receiving video to be played back at a later time.

For some applications, received data from device 400' (FIG. 4) may further expressly include an ephemeral tag associated with such data that is specified by a remote user as noted above. This tag (at the file level or packet level) is then read and observed—respected by secure app 442 as part of a communications session. As alluded to above, secure app 442 also performs the reverse operation of encoding an ephemeral header on the transmit side.

To increase security, device 400' (through its own onboard secure app) may request, require and confirm the adoption of secure ephemeral communications capability on a device 400 prior to establishing a data connection. This can be done, again, with different levels of security protocol and complexity, including everything through a simple software acknowledgement from secure app 442 (implicit verification of ephemeral capability) on device 400, all the way through allowing device 400' to coordinate with such app to control a hardware operation and write/read data directly at step 540 from ephemeral memory 410 on device 400 to confirm explicit verification of ephemeral treatment of data on such device. For example, a standardized test message (or packet) from device 400' can be written and read from device 410 (or onboard ephemeral memory 430) in an operation 540, and then checked again (at steps 550, 56) by remote device 400' to confirm that such message is no longer readable. Other verification variants to confirm proper treatment of ephemeral tagged data will be apparent to those skilled in the art.

In some applications a processor may have built-in direct address capability, or an internal bus and DMA architecture can be implemented in hardware so that it is possible to route directly from an interface (not shown) of latches and/or buffers in a communications port (FIG. 4 480) through device interface 420 and stored in ephemeral memory 416 (or onboard) in an operation 540 without also requiring storage in a general system DRAM. In other words, an operating system may be enable direct read/write of packets to an ephemeral memory 416 (or onboard), bypassing local storage and further reducing data traces/footprints. For other applications, a secondary ephemeral channel may be set up as shown in step 555 (through secondary communications device 418—FIG. 4) to directly receive Rx packet data and thus bypass device 400 entirely. Other schemes that can reduce the possibility and presence of permanent data on device 400 will be apparent to skilled artisans.

In a variant of this first mode, a user configuration may designate in an operation 570 that data created and transmitted by device 400 to a secondary device 400' also be stored and destroyed locally after it is used. As alluded to above, as part of communications operations device 400 can further specify and/or tag any specific data item (text, image, audio, video, etc.) sent to device 400' to be treated as ephemeral data. The ephemeral treatment parameter can be specified as part of the data structure for each data item as shown in step 515 (i.e. as part of the file, or part of each packet) or simply specified at the beginning of a data session (as part of a handshaking operation) to apply to every aspect of such session. It will be understood that other similar schemes may be employed as well.

In a second OTA mode, which is more comprehensive, additional data from other applications is also preferably subjected to ephemeral treatment. That is, ephemeralness is effectuated at step 585 by controlled migration and re-write of user data from other applications on a periodic or episodic basis in an operation 540 to ephemeral memory. To achieve this task, user data can be tagged with an ephemeral parameter in memories 430, 440 by an originating app (from which the data comes) or from a secure app 442 after it is invoked at step 520. It will be understood, of course, that a secure app must be given access rights by an operating system or the respective apps to perform such modification of the underlying data. Again, in some applications such app may be integrated and operating continuously as part of an operating system housekeeping procedure.

Alternatively device 400 may be configured such that any and all loaded and executing app data is first passed through or screened by secure app 442, which in turn then controls all write-read operations in accordance with a specified ephemeral parameter specified for such data from such application.

The ephemeral parameter specified at step 515 may be time based, or event based, where an event may be as simple as requiring that the data be moved in an operation 540 prior to being read. Thus when an application on device 410 attempts to read such data in a conventional device memory 430, 400, it is first stored by secure app 442 to ephemeral memory 416 in an ephemeral operation 540.

In another variant of step 515 an event may be a number (N) accesses of the data associated with a read count access parameter. After such N accesses or uses, data tagged with such expired ephemeral parameter is moved to ephemeral memory where it can be read one last time and then destroyed permanently. Other event-based limitations will be apparent to skilled artisans.

A time based parameter specified for a particular application at step 515 preferably causes data to be moved automatically from memories 430, 440 to an ephemeral memory 416 in response to detecting that a specified time has been reached. This may be varied from application to application, so that text data from an email app may be permitted to stay on device 410 longer than image data from an image sharing app. Any or all of such parameters may be specified by a user during step 520. In addition users may be alerted to such time based data migration events, either before or after to inform them of the ephemeral treatment of data for a specific application.

Both time and event based OTA parameters can be specified as part of a configuration of a data session between two devices 400 and 400,' or identified as part each file, or each communicated packet. A user of device 400 or 400' for example may specify that a particular data item (an image) should only be retained by an OTA memory for a period of time T (minutes, hours, days, etc.), or only for a certain number of accesses (reads). After such period of time, or after such numbers of accesses, the sender's data is automatically deleted in accordance with their specification, whether it has been read or not by a recipient-user of device 400. This mode may be desirable where a sender wants to ensure that his/her data is irretrievably destroyed after a few minutes of sending to avoid potential situation where the recipient loses device 410 or forgets to check received data.

The hard/physical ephemeral parameters attendant to such data are enforced through conventional erase and/or read/erase operations on device 410. Thus, device 410 may support multiple types of access operations, i.e., both read/erase and {read, erase} as separate operations. These operations in turn may be software activated (by timers/event minders within an app or firmware operating on devices 400, 410) or enforced by scheduling timers (or access counters) at the hardware level of an ephemeral controller 414. Note that in some instances to effectuate such behavior, an artificial shadow/ghost read operation step 550 (or other housekeeping operation) may be implemented in which the data is destroyed while read from device 416 even before the recipient has actually perceived it because a timeout parameter has expired.

A user may further optionally request at step 515 that the secure app move or migrate data from smartphone 400 to ephemeral memory 416 in response to some other predetermined event, such as an identified docking between device 400 and drive 410. The external device 410 may include a visual indicator to inform a user of such synching operations, and indicate such on a display of device 400. Synching operations are well-known in the art, and can be employed with variants of the present invention to facilitate ephemeral memory behavior.

In other instances another application on the device such as a native camera app, or a user game app, or a communications app, invokes secure app 510 during or at the end of a data session to migrate data off device 400 to drive 410 during operation 585. Subsequent to such operation, a third party app (or the secure app) may perform an additional secure erase or cleanup operation at step 588 to ensure that there is no remaining data retrievable from device 400. This can be achieved in different ways on different devices with varying levels of security. For example iOS devices include a feature dedicated to secure data erasure called Effaceable Storage. This feature accesses the underlying storage technology (for example, NAND) to directly address and erase a small number of blocks at a very low level. While this is only the keys, not the data itself, it still allows for some measure of protection. Similar cleanup procedures could be implemented in other operating systems.

Finally, as seen in step 555, in a third OTA mode a user may further specify that any and all received/transmitted data be routed through an ephemeral channel, which is separate from other communication channels on device 400 so that preferably (at least) no received data (and preferably no transmitted data) is ever stored in permanent form on such device. Such data may be coded at the packet level, again, with ephemeral headers. This affords a form of proxy behavior, where the OTA device supplants a host device's communications/storage facility. This ephemeral channel preferably supports and incorporates some or all of the available protocols conventionally supported by a typical portable device but can be limited as needed based on cost and performance requirements. For example, it may include only basic WiFi capability. In such embodiments, after a secure data connection is configured and established, data from device 400' is received directly by communications chip 418 so as to bypass device 400 entirely. The received data is then destroyed while (or after) it is read by one or more apps on device 400 as described above.

For each mode, as shown in FIG. 5, the operation 550 of reading data from ephemeral memory causes it to be physically and irretrievably erased during operation 560. As noted above, additional memory buffering can be employed to prevent loss of data from power glitches and the like.

The ephemeral operation of device 500 may continue until a secure session is terminated as seen at step 590. As seen above a data "session" may be set up and constitute the duration of a communications exchange between two devices 400, 400.' Alternatively device 400 may be placed into a secure session mode until an un-docking event is detected, until an application closes, and so on. Other examples will be apparent to those skilled in the art from the present teachings.

While shown in the context of an OTA (one time access) memory device, it will be understood that the hardware configuration of FIG. 4 and operations set out in FIG. 5 may be employed with other ephemeral memory types such as disclosed in Ser. No. 14/857,275 by the present inventors which is also hereby incorporated by reference.

Furthermore while shown in connection with a portable device 400, it will be understood that ephemeral memory 410 may be coupled to other conventional computing devices, including desktop computers, laptops, etc. to secure communications and user data. In instances where it includes direct communication capability, a USB based implementation in the form of a dongle, or other peripheral, may affect a secure communications link (for example through encrypted WiFi) and act as a secure proxy to prevent a host computer from being subjected to undesired received data. In other applications it may operate as an authorized media ephemeral streaming recorder as noted above, to permit additional control over content distribution.

In addition, while operations in FIG. 5 are shown as occurring in certain locations or within certain devices, it will be understood by those skilled in the art that such functions may be distributed between such devices. In other words, a reading operation (such as step 550) may involve more than one routine executing on more than one device. The particular configuration is expected to vary from application to application and device to device.

The configuration of ephemeral memory device 410 may be performed with a combination of hardware and software configurations. For example, device 410 may be hardwired to a particular operational mode, so that data is destroyed while or during reading (i.e. as part of a hybrid destructive read operation), or immediately after reading (as part of a second followup operation). In other applications such capability can be the subject of user configurations or options to permit flexible security management. In other applications such device 410 may be configurable to permit storage exclusively through a secondary channel 418, or only through interface 412, or through both, and so on. Other variants will be apparent to those skilled in the art.

As seen in FIG. 5, password protection, and encryption and decryption may be employed as well along with the present invention to increase security and privacy. Moreover as explained earlier, ephemeral parameters may be steganographically embedded within a data item (for example, an audio file, a video file, etc.) to make them less detectable and circumvented. It will be understood by those skilled in the art of course that no system can be completely foolproof, but it is expected that embodiments of the present invention will yield superior technological advantages over the prior art for protecting user data and imparting ephemeral qualities to such.

As seen above, preferably, data can be subjected to ephemeral treatment on a packet by packet basis, file by file basis, application basis, session basis, etc. Other logical constructs of data objects and data items can be tagged as well. This treatment can be incorporated within a protocol and part of a handshaking procedure in communications between two devices. This ensures that selected sensitive data is only stored into some form of ephemeral memory (OTA cells or even a basic DRAM buffer), and is prohibited from storage in non-ephemeral storage media.

It is expected that businesses will also benefit from embodiments of the invention, particularly when employees use personal mobile phones to conduct their work. By incorporating an ephemeral memory (either onboard or as part of a dedicated peripheral) and related business applications that imposes ephemeral treatment on employee data, businesses can be assured that applications used by their employees do not compromise business secrets and other confidential information that might be received on an otherwise unsecure employee phone. Because a conventional phone may be configured to never store non-ephemeral data, it can be used longer without worry of data loss.

For example, an individual image file from a user using a particular application can be tagged to include an ephemeral header with accompanying parameters. The ephemeral header may be incorporated within the data item itself using well known watermarking and/or steganographic techniques. In other applications an ephemeral header is coded and decoded for each ephemeral data packet that is created and/or received. For other applications, ephemeral treatment can be specified for any and all data items created or used during a data session, or at all times by a particular application, and so on. Other personal or business related rules can be imposed and devised to increase security and privacy.

Accordingly an ephemeral data item preferably is coded to include both ephemeral data and an ephemeral tag or ephemeral header with fields and parameters such as shown in Table 2:

TABLE 2

| Field | Description | Values |
|---|---|---|
| Ephemeral Data? | Is the item to be treated as ephemeral data | Preferably binary as designated by creator or recipient |
| Where | In which environments is item to be treated as ephemeral | data sufficient to specify host, recipient, all, etc. |
| Scope | Which applications should treat as ephemeral | data sufficient to specify which applications (all, individually, etc.) |
| Type | What kind of ephemeral treatment to be enforced | Erase while read (OTA) Erase after read (OTA) Slow/fade erase |
| Channel restriction | Where can the item be stored? | restrict to ephemeral memory only channel or permit temporary storage on recipient device |
| Time Based? | Is the item to be treated as ephemeral for a finite time | Preferably binary |
| Time Value | When does ephemeral treatment expire | future date/time data, or from date of creation (mins, hours, days, etc.) |
| Data Expiration? | Should the item be destroyed at a particular time | Preferably binary |
| Expires when | Time at which ephemeral data is destroyed by device I | future date/time data, or from date of creation |
| Buffer? | Whether data packets can be buffered by an application | Preferably binary |
| Buffer size | Maximum size of allowable buffer for ephemeral data | data sufficient to identify buffer size in non-ephemeral memory |
| Event Based? | Is data to be treated as ephemeral based on particular event? | Preferably binary |
| Trigger Event Identification | Which events trigger ephemeral treatment? | data sufficient to specify: # read accesses of data item, communicating the data item, docking between two devices, use by particular applications, etc. |

Again it should be noted that the ephemeral header field data may not be necessary in applications where it is incorporated already as a prerequisite to establishing a communications session, and a default treatment is imposed in which all data is so treated is built into a particular protocol variant. It will be appreciated by persons skilled in the art that the content of FIGS. 4 and 5, along with the accompanying description, including the explanation of the set up of the ephemeral data treatment, are more than sufficient and adequate to define the structure of suitable algorithms, code and routines and their data structures to effectuate such functions within the devices as described. In addition, contemporary device apps are typically constructed from building blocks/modules of third party code in conventional developer libraries which can be accessed to perform the functions identified. The identity, arrangement and/or modification of such modules—and their structural arrangement as embodied in computer readable code form—will be apparent to skilled artisans from the present teachings. Accordingly, unless otherwise explicitly expressed in the accompanying claims in the literally prescribed statutory format, or during the course of examination of the present application, Applicants do not invoke or intend 35 U.S.C. § 112 paragraph 6 (or its later adopted derivatives) for purposes of construing the claims.

Embodiments of the invention afford more secure end-to-end secure communications through OTA modality at every communications point. In other words, at device 400' a user may create an image captured by a camera and tag it as ephemeral (along with other parameters). A communications app on such device (not shown) "reads" such data from an OTA storage memory, causing it now to be automatically and irretrievably removed from device 400.' Such data, even if cached or buffered by a network or server 490, is then also removed from a communications pipeline during a read/transmission operation to device 400. After a user consumes/perceives such image on device 400, it is similarly physically erased. Accordingly, by adopting and enforcing OTA behavior at every data access node, secure ephemeral communications can be implemented to permit more private, secure correspondence. As little or no data is ever permanently stored anywhere, the possibility of conflict with legal authorities (to retrieve user data) is reduced as well as the data never takes root in any location—or at a minimum, not in any areas controlled by the user of device 400. As such, the embodiments enable and implement a form of data-based "right to be forgotten" integrated as part of a communications session at a controllable granular level.

What is claimed is:

1. An ephemeral non-volatile charge-storage memory device adapted to be coupled to and store selected data from one or more applications executing on a first separate host computing device comprising:
    an interface circuit adapted to exchange ephemerally designated data between the ephemeral non-volatile charge-storage memory device and the first separate host computing device;
    an ephemeral non-volatile charge-storage memory circuit adapted to store said ephemerally designated data;
    a controller circuit coupled to said interface circuit and said ephemeral non-volatile charge-storage memory device, and being adapted to process and enforce ephemeral parameters for data specified by the one or more applications on the first separate host computing device, said ephemeral parameters including instructions specifying a one time access read operation on ephemerally designated data for the one or more applications;
    wherein said one time access read operation performed by said controller circuit is implemented through a single hybrid memory operation that simultaneously both reads and alters an amount of electrical charge present on said non-volatile charge-storage memory devices so as to physically and permanently erase said ephemerally designated data on said ephemeral non-volatile charge-storage based memory circuit;
    wherein the ephemeral non-volatile charge-storage memory device comprises a floating gate configured to store electrical charge and is configured to impart ephemeral behavior to selected data received by a first separate host computing device.

2. The device of claim 1, wherein the ephemeral parameters include an instruction to automatically erase the ephemerally designated data after a predetermined period of time.

3. The device of claim 1, wherein the ephemeral parameters include an instruction to automatically erase the ephemerally designated data in response to detecting an attempted access by a device other than the first separate host computing device.

4. The device of claim 1 further including a wireless communications circuit adapted to act as a proxy and directly receive wireless ephemerally designated data from a second computing device through an ephemeral wireless communications channel that is separate from a wireless communications channel used by the first separate host computing device.

5. The device of claim 1 further including a tethering routine executing on the ephemeral charge-storage memory device which tethers it to the first separate host computing device.

6. The device of claim 5 wherein said tethering routine stores a unique identifying key or code from the first separate host computing device in a secure one-time-programmable memory.

7. The device of claim 1 further including an application routine adapted to execute on the first separate host computing device and permit user customization of said ephemeral parameters.

8. The device of claim 1 wherein said first separate host computing device is a first smartphone and the ephemeral non-volatile charge-storage memory device is connectable through a micro USB interface to implement an end to end secure communications channel between the first smartphone and a second smartphone transmitting said selected data, such that none of the selected data are stored in any non-ephemeral non-volatile memory of the first smartphone.

9. The device of claim 1 wherein said one time access read operation performed by said controller circuit is implemented through a destructive read operation which biases said non-volatile charge-storage memory devices to add electron charge through a channel hot injection process.

10. The method of claim 1 wherein a threshold voltage Vt of each memory cell in a memory array of the ephemeral non-volatile charge-storage memory device is restored to an unprogrammed level after each read of the contents of such cell.

11. The method of claim 1 wherein said single hybrid memory operation includes a phase in which a positive bias voltage is applied to a control gate of memory cells in a memory array of the ephemeral non-volatile charge-storage memory device causing electrons to flow to the floating gate of such memory cells.

12. The method of claim 1 wherein said single hybrid memory operation senses a state of memory cells in said ephemeral non-volatile charge-storage memory devices by integrating a total amount of charge flowing through such cells during the entire single hybrid memory operation.

13. The method of claim 1 wherein said single hybrid memory operation senses a state of memory cells in said ephemeral non-volatile charge-storage memory devices by detecting a total change in drain current as a function of time flowing through such cells during the single hybrid memory operation.

14. An ephemeral non-volatile charge-storage memory system adapted to temporarily store ephemerally designated data comprising:
   an ephemeral memory routine adapted to execute on a first host computing device and process ephemerally designated data received at such device; and
   an ephemeral non-volatile charge-storage memory device comprising a floating gate configured to store electrical charge and adapted to be coupled to the first host computing device, and further including:
   i) an interface circuit adapted to exchange ephemerally designated data between the ephemeral non-volatile charge-storage memory device and the first separate host computing device;
   ii) an ephemeral non-volatile memory circuit adapted to store said ephemerally designated data;
   iii) a controller circuit coupled to said interface circuit and said ephemeral non-volatile charge-storage memory, and being adapted to perform a write operation and a read operation on said ephemerally designated data;
   wherein said read operation performed by said controller circuit is implemented through a single hybrid memory operation that simultaneously both reads and alters an amount of electrical charge present on said non-volatile charge-storage memory devices so as to physically and permanently erase said ephemerally designated data on said ephemeral non-volatile charge-storage memory circuit.

15. The system of claim 14 wherein said ephemeral memory routine has multiple ephemeral parameters configurable by a user of such first host computing device, including different ephemeral modes, each defining an ephemeral treatment to be enforced at the first host computing device for any ephemerally designated data.

16. The system of claim 15 wherein enabling a first ephemeral mode causes any data received by the first host computing device to be stored in said ephemeral non-volatile charge-storage memory circuit.

17. The system of claim 15 wherein enabling a first ephemeral mode causes any data file received by said ephemeral memory routine to only be stored in non-volatile form in said ephemeral non-volatile charge-storage memory circuit and only portions of said data file are stored in a transitory memory of the first separate host computing device.

18. The system of claim 15 wherein enabling a first ephemeral mode causes data communicated by a second host computing device during a data session to the first separate host computing device to be received directly by said ephemeral non-volatile charge-storage memory device and/or an ephemeral charge-storage memory onboard said first separate host computing device.

19. The system of claim 15 wherein said hybrid memory operation includes one of a destructive read which biases said charge-storage memory devices to add electron charge through a channel hot injection process.

\* \* \* \* \*